(12) United States Patent
Walsh et al.

(10) Patent No.: US 12,126,313 B2
(45) Date of Patent: Oct. 22, 2024

(54) SYSTEM AND METHOD FOR ADAPTIVE SOUND EQUALIZATION IN PERSONAL HEARING DEVICES

(71) Applicant: DTS, Inc., Calabasas, CA (US)

(72) Inventors: Martin Walsh, Scotts Valley, CA (US); Michael M. Goodwin, Scotts Valley, CA (US)

(73) Assignee: DTS Inc., Calabasas, CA (US)

(*) Notice: Subject to any disclaimer, the term of this patent is extended or adjusted under 35 U.S.C. 154(b) by 17 days.

(21) Appl. No.: 17/543,357

(22) Filed: Dec. 6, 2021

(65) Prior Publication Data

US 2022/0166396 A1 May 26, 2022

Related U.S. Application Data

(63) Continuation of application No. PCT/US2020/036519, filed on Jun. 7, 2020.

(60) Provisional application No. 62/858,469, filed on Jun. 7, 2019.

(51) Int. Cl.
*H03G 5/16* (2006.01)
*G06N 20/00* (2019.01)
*G10K 11/178* (2006.01)
*H03G 5/00* (2006.01)

(52) U.S. Cl.
CPC ............. *H03G 5/165* (2013.01); *G06N 20/00* (2019.01); *G10K 11/17823* (2018.01); *G10K 11/17853* (2018.01); *H03G 5/005* (2013.01)

(58) Field of Classification Search
CPC .. H03G 5/165; H03G 5/005; G10K 11/17823; G10K 11/17853; G06N 20/00
See application file for complete search history.

(56) References Cited

U.S. PATENT DOCUMENTS

| | | | |
|---|---|---|---|
| 6,118,878 A | 9/2000 | Jones | |
| 7,103,188 B1 | 9/2006 | Jones | |
| 8,550,206 B2 | 10/2013 | Keady et al. | |
| 9,050,212 B2 | 6/2015 | Gauger, Jr. | |
| 9,288,569 B2 | 3/2016 | Reimert | |
| 9,516,407 B2 | 12/2016 | Goldstein et al. | |
| 9,640,167 B2 | 5/2017 | Defranks et al. | |
| 9,858,912 B2 | 1/2018 | Hamalainen | |
| 10,219,083 B2* | 2/2019 | Farmani | H04R 25/552 |
| 2002/0080979 A1 | 6/2002 | Brimhall et al. | |
| 2005/0058313 A1* | 3/2005 | Victorian | H04R 25/554 |
| | | | 381/328 |

(Continued)

OTHER PUBLICATIONS

International Search Authority/European Patent Office, International Search Report and Written Opinion of International Application No. PCT/US2020/036519 filed Jun. 7, 2020. Report completed Aug. 25, 2020, mailed Sep. 2, 2020, 11 pages.

*Primary Examiner* — Daniel R Sellers (74) *Attorney, Agent, or Firm* — Lerner David LLP (57) ABSTRACT

Embodiments of systems and methods for adaptive sound equalization in personal hearing devices are disclosed. In some embodiments a microphone in a personal hearing device receives sound from the listener's environment. The sound then is analyzed to determine one or more desired targets, for instance loudness level or spectral balance. The determined targets then are used to control adaptive processing of the sound received by the microphone to generate a perceptually improved sound to render to the listener.

12 Claims, 9 Drawing Sheets

(56) References Cited

U.S. PATENT DOCUMENTS

| | | | |
|---|---|---|---|
| 2006/0140425 A1* | 6/2006 | Berg | A61B 5/00 |
| | | | 381/312 |
| 2009/0310805 A1* | 12/2009 | Petroff | H04R 25/453 |
| | | | 381/328 |
| 2010/0041330 A1* | 2/2010 | Elg | H04M 1/72403 |
| | | | 455/3.06 |
| 2011/0200217 A1* | 8/2011 | Gurin | A61B 5/123 |
| | | | 381/320 |
| 2012/0084084 A1 | 4/2012 | Zhu et al. | |
| 2013/0251179 A1* | 9/2013 | Aschoff | G06F 8/61 |
| | | | 381/314 |
| 2014/0064513 A1* | 3/2014 | Behringer | H03G 3/3026 |
| | | | 381/77 |
| 2014/0126733 A1 | 5/2014 | Gauger, Jr. et al. | |
| 2014/0126734 A1 | 5/2014 | Gauger, Jr. et al. | |
| 2014/0126735 A1 | 5/2014 | Gauger, Jr. | |
| 2014/0314261 A1* | 10/2014 | Selig | H04R 25/70 |
| | | | 381/314 |
| 2014/0341387 A1 | 11/2014 | Gauger, Jr. et al. | |
| 2015/0195663 A1* | 7/2015 | Lin | G06F 16/635 |
| | | | 381/58 |
| 2015/0281853 A1 | 10/2015 | Eisner et al. | |
| 2016/0127818 A1 | 5/2016 | Ambrose | |
| 2016/0163303 A1* | 6/2016 | Benattar | G10K 11/17857 |
| | | | 381/71.11 |
| 2016/0351183 A1 | 12/2016 | Gauger, Jr. et al. | |
| 2016/0366518 A1* | 12/2016 | Strogis | H04S 7/306 |
| 2017/0230024 A1 | 8/2017 | Lu et al. | |
| 2017/0324390 A1* | 11/2017 | Wheatley | H03G 9/025 |
| 2018/0021176 A1 | 1/2018 | Bernier et al. | |
| 2018/0182371 A1 | 6/2018 | Thormundsson | |
| 2019/0103848 A1 | 4/2019 | Shaya et al. | |
| 2019/0196777 A1* | 6/2019 | Kovacevic | G06F 3/165 |
| 2019/0278556 A1* | 9/2019 | Usher | G06F 3/04842 |

* cited by examiner

SYSTEM AND METHOD FOR ADAPTIVE SOUND EQUALIZATION IN PERSONAL HEARING DEVICES

RELATED APPLICATION AND PRIORITY CLAIM

This application is a continuation of International Application No. PCT/US2020/036519 filed on Jun. 7, 2020, which application is related to and claims priority to U.S. Provisional Application No. 62/858,469, filed on Jun. 7, 2019, and entitled "ACTIVE AND PASSIVE NOISE CANCELATION WITH ACTIVE EQUALIZATION," which applications are hereby incorporated by reference in their entireties.

BACKGROUND

Some listening experiences such as music concerts can be perceptually suboptimal. For instance, a popular music concert in a large venue may be rendered at an extremely loud level that may be both unsatisfactory to a listener's taste and potentially harmful to the listener's hearing. Furthermore, the music may be rendered with an unfavorable spectral imbalance, for instance with excessive bass. Such issues arise in other scenarios as well and are a common hindrance to the listening experience. For example, a listener may want to hear a conversation more clearly in a noisy environment such as an airplane or while using public transportation. In another example, a cyclist on a city street may want to have their listening device be acoustically transparent for the sake of safety while still limiting the deleterious effects of excessive noise pollution from passing vehicles or road work. Preferences with respect to level and equalization may vary from person to person and may depend on the listening environment. Thus it is desirable for a listener to be able to control and customize both the loudness and the spectral equalization of a sound scene experienced by the listener based on that listener's personal preferences.

A common approach to loudness reduction and hearing protection in loud listening environments such as a music concert is the use of foam ear plugs. The goal of using foam earplugs is to attenuate the sound reaching the eardrum by a physical blockage of the ear canal. While this does reduce the sound reaching the eardrum, such earplugs reduce high-frequency content disproportionately more than low-frequency content. This can negatively impact the spectral balance of the sound for the listener. The spectral balance issue is not addressed by current solutions available to consumer listeners.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The listening experience at live music concerts and in other scenarios can be perceptually suboptimal. For instance, they may be rendered at a level that is too loud for the listener's comfort or auditory health and with a spectral balance that does not match the listener's preference. Embodiments of the present invention address both the loudness and spectral balance issues to improve listening experiences.

Embodiments of the system and method disclosed herein use novel techniques to integrate passive sound suppression and adaptive sound equalization to process an incoming audio signal in real time in a personal hearable device. Embodiments of the system and method described herein include novel techniques that actively monitor and adapt the spectral balance, dynamics and loudness characteristics of 'real-world' auditory events (such as music performance) in order to adaptively match target performance criteria. This has not been attempted by any other product or application and solves the commonly experienced problems relating to the combination of effective hearing protection and improved sound quality in scenarios such as live acoustic performance.

Embodiments of the present invention use an earbud form factor for level attenuation as in the use of earplugs. In some embodiments the present invention uses an acoustically sealed over-the-ear headset. In some embodiments, a pair of earbuds is used by the listener, one in each ear. In other embodiments, the earbuds each include an external microphone for receiving the incoming sound, an internal signal processing unit for processing the incoming sound, and a transducer for rendering the processed sound to the listener. In some embodiments, the earbuds each further include an internal microphone to monitor the sound rendered to the listener. Other embodiments of the present invention use a headphone form factor with acoustically sealed ear cups. In some embodiments, the headphones include an external microphone at each ear for receiving the incoming sound. In some embodiments, an internal microphone is further included at each ear to monitor the sound rendered to the listener.

A listener's preferences may vary depending on the listening environment. For instance, in a purely noisy environment a listener's preference may be to not hear any of the sounds from the environment. In other cases, a listener's preference may be to hear the sounds from the environment but at an attenuated level, for instance to maintain some awareness of the environment. In other cases, a listener's preference may be to hear the environmental sounds but with an improved spectral balance. In other cases, a listener's preference may be to selectively hear aspects of the environmental sound. In some cases, environmental sounds may vary in time such that continually meeting a listener's preferences may require some adaptation to the environment. As such, it is of interest to adaptively control the level and spectral balance of the incoming sound so as to improve the listening experience. In some embodiments, the adaptive processing of the incoming sounds is configured to achieve a target level. In some embodiments, the adaptive processing of the incoming sounds is configured to achieve a target spectral balance.

Some embodiments of the present invention establish a target loudness for rendering sounds based in part on user preference. Some embodiments of the present invention establish a target loudness for rendering sounds based in part on mandated hearing protection guidelines. Some embodiments establish a target spectral balance for rendering incoming sounds based in part on a user setting. Some embodiments establish a target spectral balance by analyzing the incoming sound to determine a spectral balance in accordance with the analysis results. For instance, the analysis may determine that the incoming sound is jazz music such that the user's preferred equalization for jazz music should inform the selection of the target balance.

Embodiments of systems and methods for adaptive sound equalization in personal hearing devices are disclosed. In some embodiments a method for processing an incoming audio signal applies active equalization to the incoming audio signal to obtain an equalized audio signal. This equalized audio signal then is tuned to a target equalization to obtain an output audio signal. The output audio signal is rendered for playback to a listener. The output audio signal is a perceptually improved version of the incoming audio signal, at least to the specific listener for whom the target equalization is tuned.

In some embodiments the method includes determining the target equalization based on a knowledge of an artist's recordings. Typically this is a musical artist whose recording is contained in the incoming audio signal. In some embodiments one or more machine learning techniques are used to analyze a database containing the artist's recordings. This allows embodiments of the system and method determine the target equalization based on the database of the artist's recordings. In some embodiments an active filter is used to tune the equalized audio signal to the target equalization.

Embodiments of the invention also include a method for processing an incoming audio signal including actively monitoring audio characteristics of the incoming audio signal and providing target data that contains target performance criteria. In some instances this target data includes a listener's audiogram or measured hearing loss curve. This allows the incoming audio to be tuned or adapted such that certain frequencies that the listener may have trouble hearing can be amplified. In some embodiments the method includes emphasizing dialogue frequency bands to obtain the adapted audio characteristics. This allows the listener to hear the dialogue in a television show or movie which otherwise may be difficult for the listener to hear.

Embodiments of the method also include adapting the audio characteristics of the incoming audio signal to the target performance criteria to obtain adapted audio characteristics of the incoming audio signal. In some embodiments adapting the audio characteristics is achieved by updating an adaptive filter based on the target performance criteria. The adapted audio characteristics are rendered in an output signal. This provides the listener with a better listening experience from the output signal as compared to the incoming audio signal. In some embodiments the adapted audio characteristics in the audio signal are rendered on a personal hearing device.

In some embodiments a microphone in a personal hearing device receives sound from the listener's environment. The sound then is analyzed to determine one or more desired targets, for instance loudness level or spectral balance. The determined targets then are used to control adaptive processing of the sound received by the microphone to generate a perceptually improved sound to render to the listener.

Embodiments of the method also include identifying a song that is in the incoming audio signal to obtain an identified song and determining the target data based on the identified song. Other embodiments include identifying a genre of a song that is in the incoming audio signal to obtain an identified genre and determining the target data based on the identified genre. Still other embodiments include identifying audio characteristics of unwanted sounds in the incoming audio signal and determining the target data based on the audio characteristics of the unwanted sounds.

Embodiments also include a hearable device for processing an incoming audio signal. The hearable device includes a processor and a memory that stores instructions. These instructions, when executed by the processor, configure the hearable device to actively monitor audio characteristics of the incoming audio signal. The hearing device also is configured to provide target data that contains target performance criteria and adapt the audio characteristics of the incoming audio signal to the target performance criteria to obtain adapted audio characteristics of the incoming audio signal. These adapted audio characteristics are rendered in an output signal as an improved auditory experience for the listener.

For the purposes of summarizing the disclosure, certain aspects, advantages, and novel features of the inventions have been described herein. It is to be understood that not necessarily all such advantages can be achieved in accordance with any particular embodiment of the inventions disclosed herein. Thus, the inventions disclosed herein can be embodied or carried out in a manner that achieves or optimizes one advantage or group of advantages as taught herein without necessarily achieving other advantages as can be taught or suggested herein.

It should be noted that alternative embodiments are possible, and steps and elements discussed herein may be changed, added, or eliminated, depending on the particular embodiment. These alternative embodiments include alternative steps and alternative elements that may be used, and structural changes that may be made, without departing from the scope of the invention.

BRIEF DESCRIPTION OF THE DRAWINGS

Throughout the drawings, reference numbers are re-used to indicate correspondence between referenced elements. The drawings are provided to illustrate embodiments of the inventions described herein and not to limit the scope thereof.

DETAILED DESCRIPTION

As described above in the Background and Summary, real-world listening experiences may be perceptually degraded by extreme loudness, poor spectral balance, or other factors. As such, a useful solution would address the two objectives of loudness reduction and preservation of a preferable spectral balance. With 32 million people attending at least one live music festival in 2014 (according to Nielsen), it is clear there are a large number of potential users who may benefit from an improved live music listening experience.

One example of a degraded listening experience is a large-arena music concert. An audience member of a typical rock concert can be exposed to an average sound level of 120 dB SPL, which can induce short-term hearing problems such as ringing in the ears and long-term hearing problems such as permanent hearing loss. As a further degradation to the listening experience, large subwoofers and low-frequency acoustic modes of the venue can create significant spectral imbalance and loss of clarity of the performance. Such degradations can depend on seating position. Another example of a degraded listening experience is a blockbuster movie, where sound levels in theaters can be dangerously loud. In such scenarios as concerts or movies, a listener may prefer to limit the loudness to a desirable level. A listener may prefer to render the sound with a desirable spectral balance. In some cases, a listener may choose a spectral balance target that compensates for the listener's audiogram or a spectral balance that emphasizes dialogue. In some cases, a listener may prefer to render the sound with the spectral balance of the original program material without incurring the degrading spectral effects of the listening environment. Accordingly, embodiments of the present invention provides adaptive sound equalization and level adjustment in personal hearing devices to address such preferences.

Listeners may prefer adaptive reproduction of external sounds in personal hearing devices in yet other listening scenarios than those described above. For example, in carrying on a conversation in a noisy environment such as an airplane or public transit, the listener may prefer to have background noise attenuated while having speech enhanced. As another example, a listener using personal hearing devices such as earbuds or headphones to listen to music may be not be able to hear potentially important sounds from the external environment, for instance the sound of vehicle traffic or a public address announcement. Such external sounds can be rendered to the listener while limiting the exposure of the listener to excessively high sound levels that may be objectionable to the listener or harmful to the listener's hearing. Accordingly, embodiments of the present invention provides adaptive sound equalization and level adjustment in personal hearing devices to enable improved rendering of external sounds of interest to the listener.

Embodiments of the present invention also include a personal hearing device in an earbud form factor. The earbud form factor provides some attenuation (or passive suppression) of incoming sound from the user's environment by virtue of physical blockage of the ear canal. Embodiments of the present invention also include personal hearing device in a headphone form factor, which can similarly provide passive attenuation of sounds from the user's environment.

The use of earplugs for passive loudness attenuation is common at concerts. Some active personal hearing devices are configured to apply a fixed gain or a fixed equalization to sounds from the listener's environment. Embodiments of the present invention improve upon previous approaches by adapting the sound rendered to the listener to a specific loudness level, which can be specified by the listener or in accordance with guidelines for safe listening levels. Embodiments of the present invention improve upon previous approaches by adapting the sound rendered to the listener to achieve a specified spectral balance, which can be specified by the listener or in accordance with data associated with the sound to be rendered.

Figure 1:
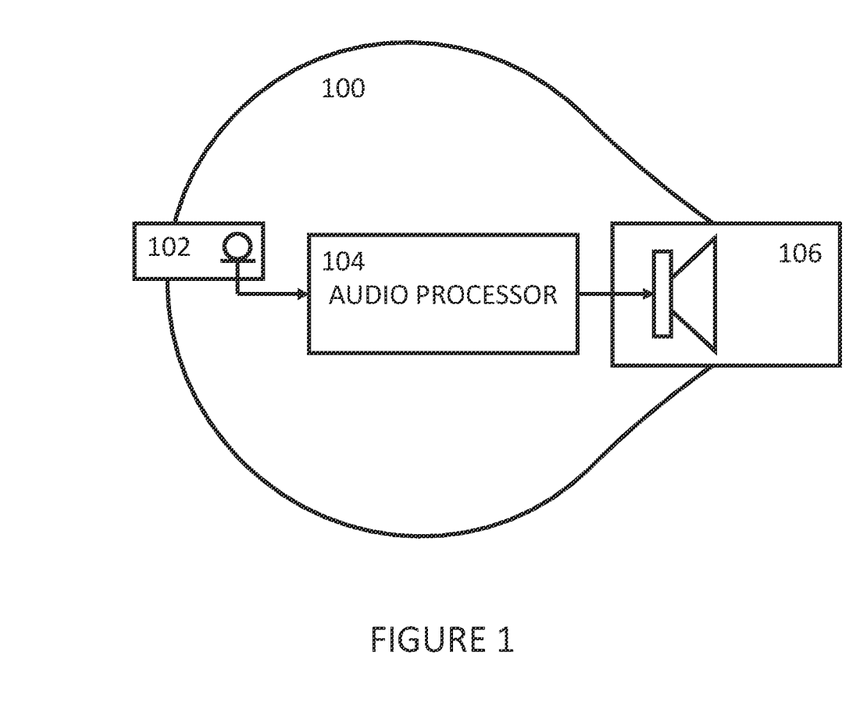
FIG. 1 illustrates a first exemplary embodiment of a personal hearing device in an earbud form factor in accordance with embodiments of the present invention.

In accordance with some embodiments of the present invention, FIG. 1 illustrates a first exemplary embodiment of the present invention as a personal hearing device 100 in the form factor of an earplug or earbud to be inserted in a listener's ear canal. The depicted device includes an external microphone to receive incoming sound, an audio processor to process the received sound, and an internal transducer to render sound to the listener. It should be noted that an "external microphone" is a microphone that is open to the external listening environment. In contrast, an "internal microphone" is a microphone that is open to the listener's ear. Similarly, an "internal loudspeaker" is a loudspeaker that is open to the listener's ear. Typically there is some type of physical acoustic barrier between an external microphone and an internal microphone. While the depiction shows a single element, in typical embodiments such a device is used in each of the listener's ears.

Referring to FIG. 1, the personal hearing device 100 is in a shape designed to provide occlusion of a listener's ear canal such that external sounds are physically blocked from arriving in the ear canal. A ported microphone 102 is open to the exterior environment to receive incoming acoustic signals. In other words, sounds that have acoustically propagated from the listener's environment to the listener. The ported microphone 102 transduces the received acoustic signal to an electrical form. The transduced electrical signal is provided to an audio processor 104, which in turn provides a processed signal to a loudspeaker 106, which is ported into the ear canal. The loudspeaker 106 transduces the processed signal into an acoustic signal for conveyance via the user's ear canal to the user's ear drum.

Figure 2:
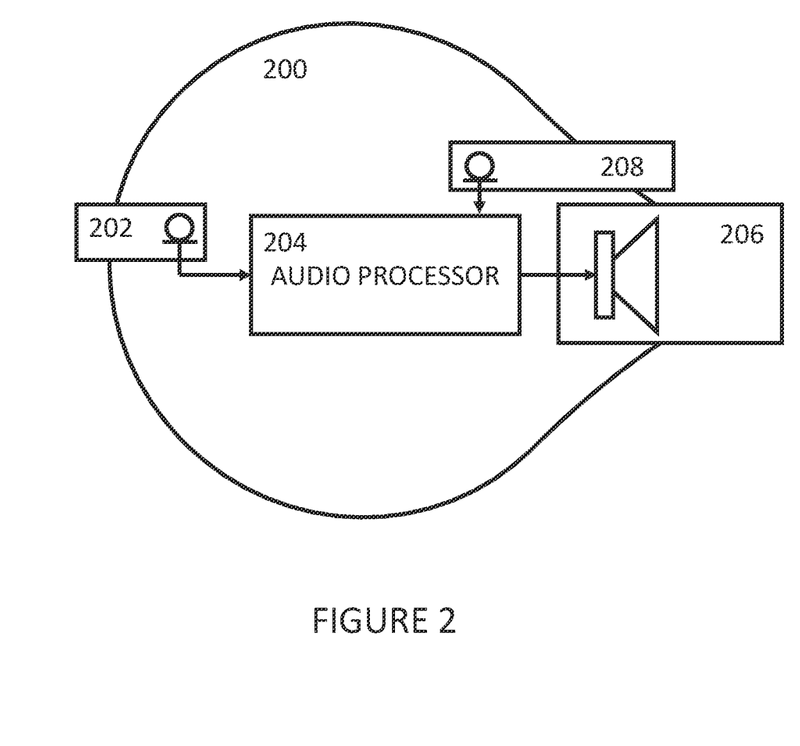
FIG. 2 illustrates a second exemplary embodiment of a personal hearing device in an earbud form factor in accordance with embodiments of the present invention.

In accordance with some embodiments of the present invention, FIG. 2 illustrates a second exemplary embodiment of the present invention as a personal hearing device 200 in the form factor of an earplug or earbud to be inserted in a listener's ear canal. While the depiction shows a single element, in typical embodiments such a device is used in each of the listener's ears. The personal hearing device 200 includes an external microphone to receive incoming sound, an audio processor to process the received sound, an internal transducer to render sound to the listener, and an internal microphone to monitor the sound rendered to the listener. The signal received by the internal microphone is also provided to the processor.

Referring to FIG. 2, the personal hearing device 200 is in a shape designed to provide occlusion of the ear canal such that external sounds are physically blocked from arriving in the ear canal. A ported microphone 202 is open to the exterior environment to receive incoming acoustic signals. The microphone transduces the received acoustic signal to an electrical form. The transduced electrical signal is provided to an audio processor 204, which in turn provides a processed signal to a loudspeaker 206, which is ported into the ear canal. The loudspeaker 206 transduces the processed signal into an acoustic signal for conveyance via the user's ear canal to the user's ear drum.

A ported microphone 208 is open to the ear canal to transduce the internal acoustic signal to an electrical form. The signal in electrical form is provided to the audio processor 204 to monitor the acoustic signal in the ear canal, which is a combination of the acoustic signal rendered by the loudspeaker 206 and any external sounds which physically propagate to the interior. For example, external sounds may not be completely blocked by the ear-canal occlusion of personal hearing device 200 and may thus propagate in part to the ear canal.

Figure 3:
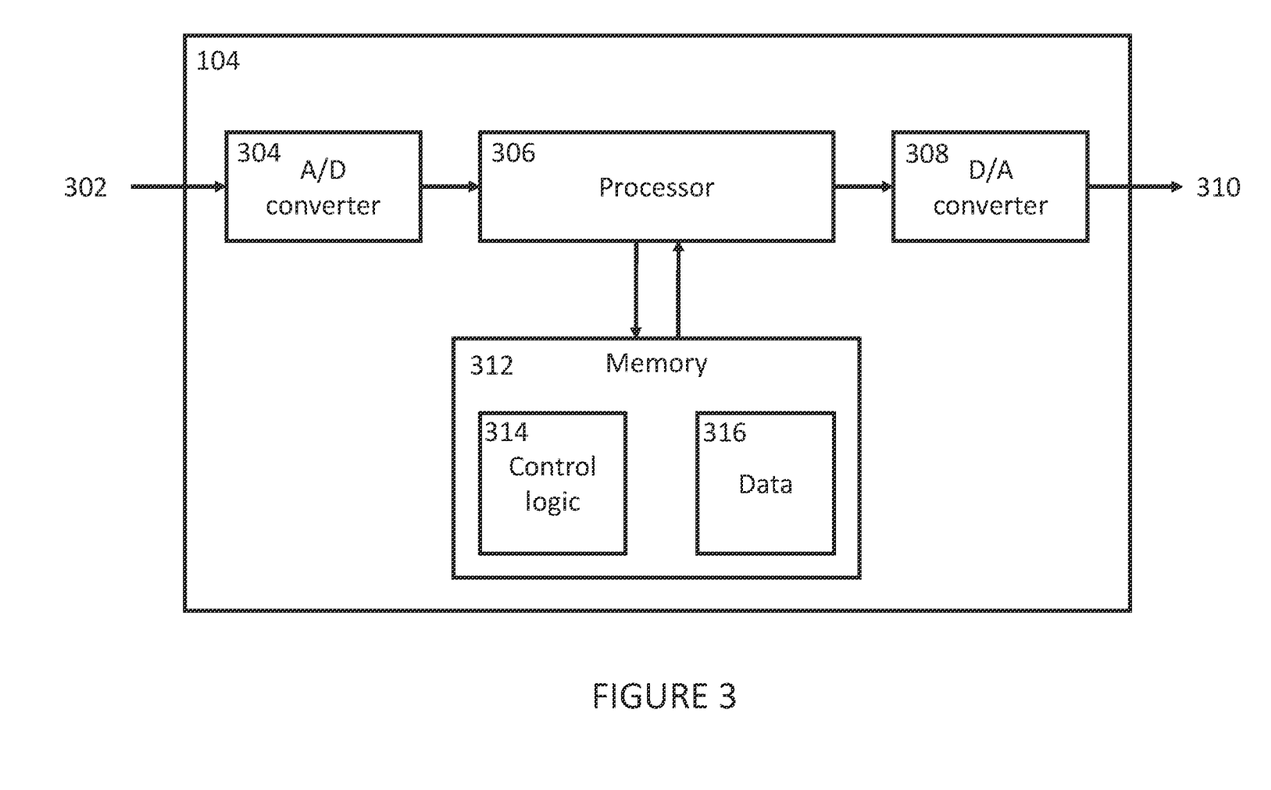
FIG. 3 is a system block diagram of the audio processor shown in FIG. 1 in accordance with embodiments of the present invention.

FIG. 3 is a block diagram of the audio processor 104 shown in FIG. 1 in accordance with some embodiments of the present invention. The audio processor 104 receives an output signal from a microphone (not shown) as input on line 302. An analog/digital converter 304 converts the signal 302 from an analog signal to a digital signal, which is provided as input to a processor 306.

The processor 306 outputs a processed digital signal, which is converted from a digital signal to an analog signal by a digital/analog converter 308. The output of the digital/analog converter is provided on line 310 for subsequent transduction by a loudspeaker (not shown). Those of ordinary skill in the art will appreciate that audio processor 204 (or audio processors for yet other embodiments of the present invention) shown in FIG. 2 would comprise similar components as those described for audio processor 104. For example, embodiments using the audio processor 204 would include a second microphone input, a second analog/digital converter, and a second digital input to the central processor.

In the block diagram shown in FIG. 3, the central processor 306 is connected to a memory unit 312. In some embodiments the central processor 306 stores information in the memory unit 312 and retrieves information from the memory unit 312. In some embodiments the memory unit 312 includes a control logic 314. In some embodiments the memory unit 312 includes a data unit 316. The data unit 316 stores data derived by the central processor 306, for instance energy measures for a number of frequency bands of the input audio signal. In some embodiments the data unit 316 stores data to be used by the central processor 306. In some embodiments, the data unit 316 stores a target loudness level for the sound to be rendered to the listener. The target loudness in some embodiments is used by the central processor 306 to determine, at least in part, the processing needed on the processor input signal to determine the processor output signal. In some embodiments, the data unit 316 stores a target spectral balance, sometimes referred to as a spectral equalization, for the sound to be rendered to the listener. In some embodiments the target spectral balance is used by the central processor 306 to determine, at least in part, the processing needed on the processor input signal to determine the processor output signal.

As described above, in some embodiments the data unit 316 stores target data for use by the central processor 316 in determining the processing needed on the input signal to generate the output signal. The target data may include a target average loudness level for the output signal. The target data may include a target peak loudness level for the output signal. The target data may include a target spectral balance or equalization for the output signal. The target data may include information other than a target loudness level or a target spectral balance. In some embodiments of the invention, the target data corresponds to a default setting. In some embodiments, the target data is based at least in part on a user-selected preset. In some embodiments the target data may be fixed. In some cases, the target data may be time-varying. In some embodiments, the target data is based at least in part on user input. For instance, a user selecting a target loudness level or establishing a target spectral balance. In some embodiments, the target data is based at least in part on analysis of the signal transduced by the external microphone (such as microphone 102 shown in FIG. 1 or microphone 202 shown in FIG. 2). In other words, the target data may be based at least in part on analysis of the sounds in the listener's environment.

For example, in a live concert scenario, the input signal, or certain features of the input signal, can be streamed to a music recognition application that can identify a song and return target data relating to that song, for instance a target loudness or a target spectral balance. This data can be used to determine, at least in part, the target data used by the central processor 316. In other cases, for example when such data is unavailable as part of a music recognition service, such song-specific target data can be precomputed offline locally using the user's own content library, for instance by analyzing the spectral balance and loudness characteristics of relevant portions of the library, for instance songs by particular artists or songs in a particular genre.

Figure 4:
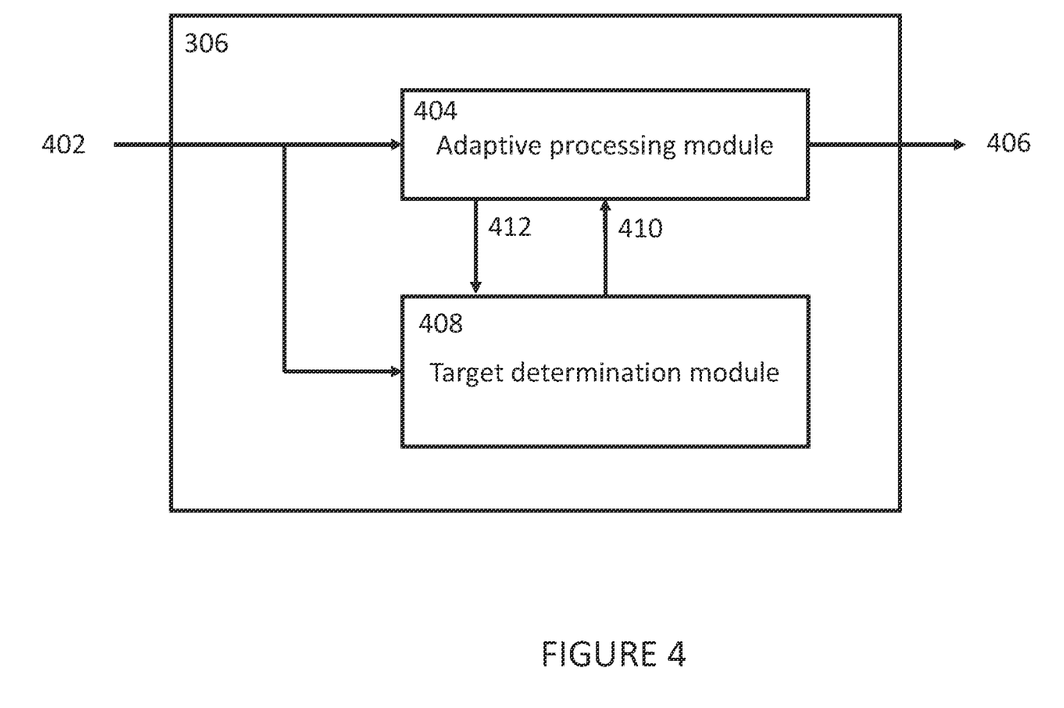
FIG. 4 is a block diagram of the central processor shown in FIG. 3 in accordance with embodiments of the present invention.

FIG. 4 is a processing block diagram of the central processor 306 shown in FIG. 3 in accordance with embodiments of the present invention. Referring to FIG. 4, the central processor 306 includes an adaptive processing module 404 and a target determination module 408 that provides data to at least in part control the operation of the adaptive processing module 404. The central processor 306 receives a digital audio signal as input on line 402. The digital audio signal is processed by the adaptive processing module 404, which provides a digital audio signal as output on line 406. The digital audio signal on line 402 is further provided as input to the target determination module 408. In some embodiments the target determination module 408 determines target data to provide to the adaptive processing module 404 on line 410 based at least in part on the input digital audio signal on line 402. In some embodiments, the adaptive processing module 404 provides data to the target determination module 408 on line 412. In some embodiments the target determination module 408 uses the data on line 412 to at least in part determine target data to provide to the adaptive processing module 404 on line 410.

In some embodiments, the adaptive module 404 is configured to not provide data to the target determination module 408. In some embodiments, the target determination module 408 is configured to not receive the digital audio signal on line 402. Those of ordinary skill in the art will understand and appreciate that variations of the configuration of the central processor 306 can be made. For example, some embodiments of the present invention include the incorporation of a second digital audio input signal to the processor in accordance with the audio processor 204, shown in FIG. 2.

Figure 5:
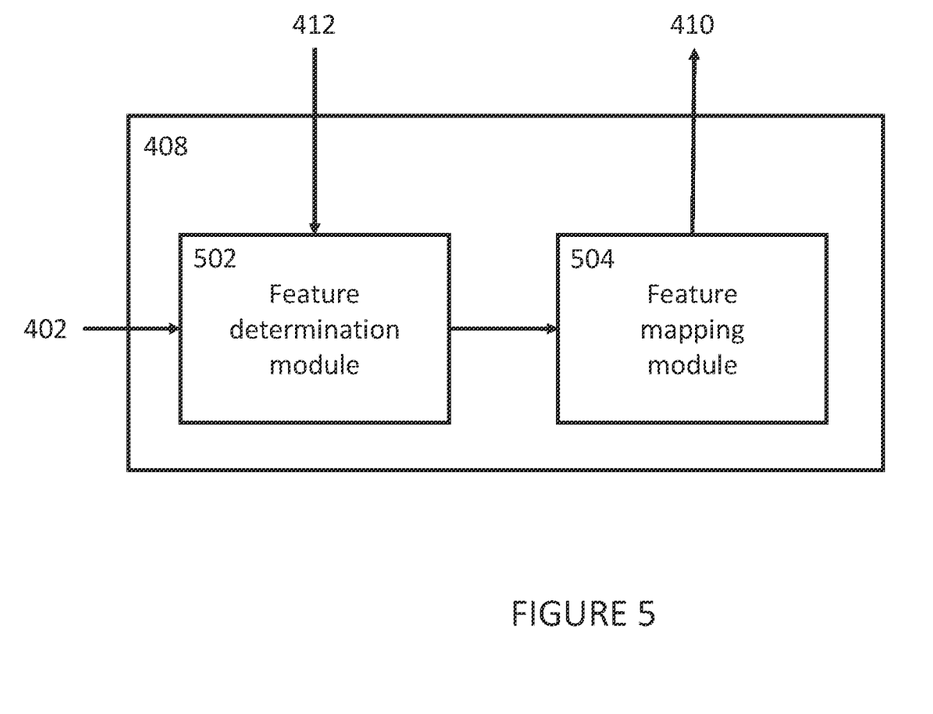
FIG. 5 is a block diagram of the target determination module shown in FIG. 4 according to embodiments of the present invention.

FIG. 5 is a block diagram of the target determination module 408 shown in FIG. 4 according to embodiments of the present invention. In some embodiments, the target determination module 408 receives a digital audio signal as input on line 402. In some embodiments, the target determination module 408 receives data from the adaptive processing module 404 on line 412.

In some embodiments, a feature determination module 502 determines features related to the sounds in the listener's environment based at least in part on the digital audio signal on line 402. In some embodiments, the feature determination module 502 determines features related to the sounds in the listener's environment based at least in part on data from the adaptive processing module 404 provided on line 412. The feature determination module 502 outputs features to a feature mapping module 504. The feature mapping module 504 determines target data based at least in part on the features provided by the feature determination module 502. The feature mapping module 504 provides target data on line 410 to the adaptive processing module 404.

In some embodiments, the feature mapping module 504 includes components for communicating with a device or system that is external to hearing device 100 for hearing device 200. By way of example, these components include a personal device such as a smartphone or a cloud-based system such as a data server. The feature mapping module 504 communicates features to the external device or system. The external device or system uses the features to determine target data. The external device or system communicates target data to feature mapping module 504.

In some embodiments, the external device or system uses the features to identify a song being played in the listener's environment and determines target data in accordance with the identified song. In some embodiments, the external device or system uses the features to identify the genre of music being played in the listener's environment and also determines target data in accordance with the identified genre. In some embodiments, the external device uses the features to determine characteristics of undesired sounds in the listener's environment such as background noise and determines target data in accordance with the determined characteristics.

Figure 6:
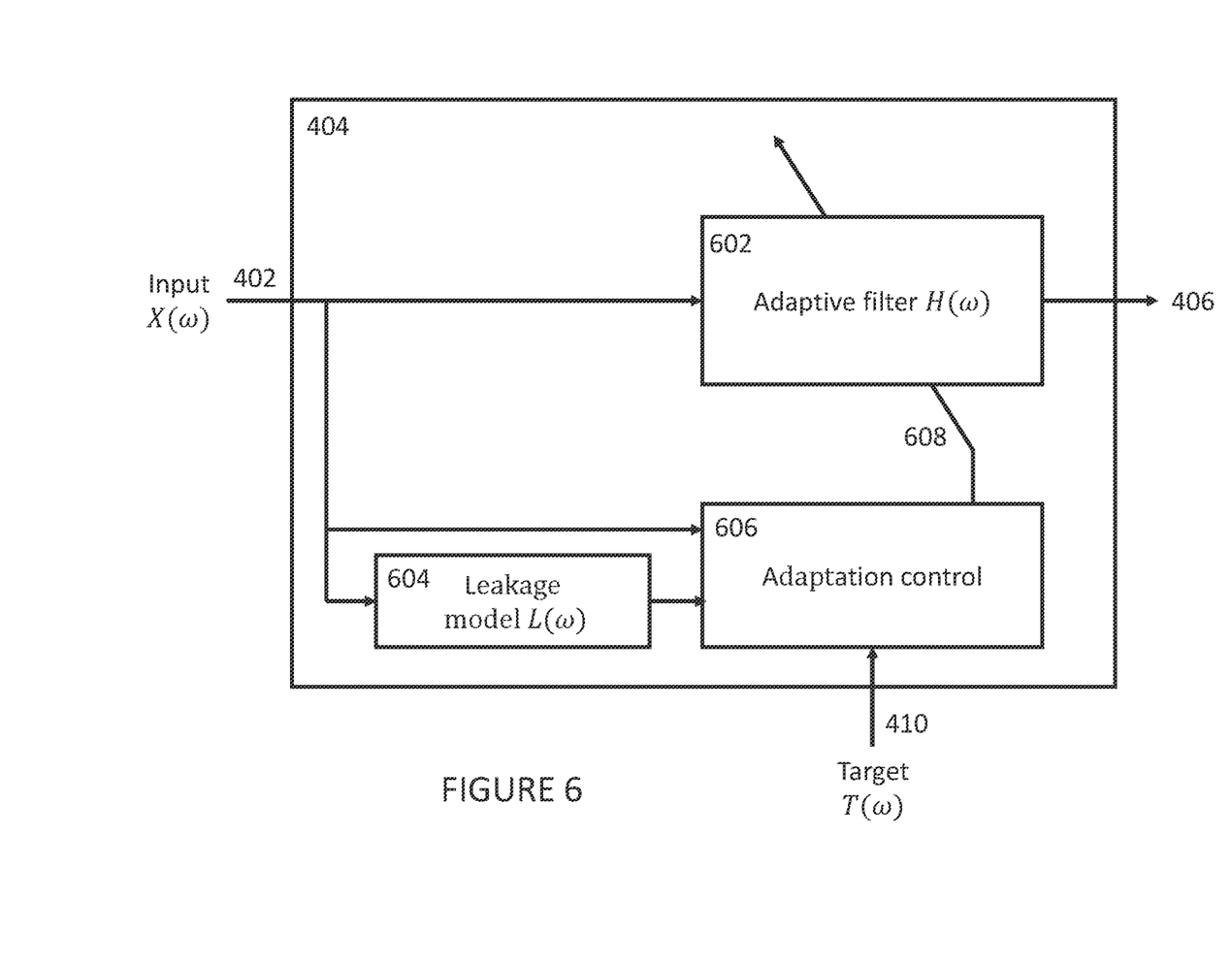
FIG. 6 is a block diagram of the adaptive processing module shown in FIG. 4 in accordance with first embodiments of the present invention.

FIG. 6 is a block diagram of the adaptive processing module 404 shown in FIG. 4 in accordance with first embodiments of the present invention. As shown in FIG. 6, the adaptive processor module 404 receives an input signal $X(\omega)$ on line 402, which corresponds to a digital form of a signal received by an externally ported microphone of the hearing device, for instance microphone 102 shown in FIG. 1. The input signal $X(\omega)$ is provided as input to an adaptive filter 602. The transfer function of the adaptive filter 602 is denoted in FIG. 6 by $H(\omega)$. The input signal is further provided as input to an adaptation control module 606 and a leakage model 604. The leakage model 604 comprises at least in part a transfer function $L(\omega)$. The output of the leakage model 604 $L(\omega)X(\omega)$ corresponds to an estimate of the sound from the listener's environment that leaks through the occlusion of the hearing device (for example personal hearing device 100 shown in FIG. 1) into the listener's ear canal. Those of ordinary skill in the art will understand that $\omega$ is a frequency variable and that the signals and systems herein are being considered in the frequency domain. For instance, $X(\omega)$ is a frequency-domain representation of the input signal. Those of ordinary skill in the art will understand that digital signal processing, for instance in processor 306, can be carried out in a frequency domain by incorporating an appropriate forward transformation before frequency-domain processing and an appropriate inverse transformation after frequency-domain processing, for instance a sliding-window short-time Fourier transform as a forward transformation and an inverse short-time Fourier transform with overlap-add as an inverse transformation.

In some exemplary embodiments this leakage is accounted for in the adaptation control module 606. Target data $T(\omega)$ is provided to the adaptation control module 606 on line 410. The adaptation control module 606 provides control data on line 608 to the adaptive filter 602. This adaptive filter 602 can be, for instance, updated in accordance with one or more of the inputs to the adaptation control module 606.

In some embodiments, the adaptation control module 606 is configured to determine a filter such that sound received by the listener has a target spectral balance $T(\omega)$. For this mathematical development, the sounds received by the listener are represented as the sum of the output of the adaptive filter 602 and the leakage of external sounds through the occlusion of the personal hearing device 100 into the listener's ear canal.

This is mathematically denoted as:

$$Y(\omega)=H(\omega)X(\omega)+L(\omega)X(\omega) \quad (1)$$

where $Y(\omega)$ denotes the sound receives by the listener, $H(\omega)X(\omega)$ is the output of the adaptive filter, and $L(\omega)X(\omega)$ is an estimate of the leakage.

The filter $H(\omega)$ is determined by minimizing a measure of the difference between the output spectrum $Y(\omega)$ and the target $T(\omega)$. In some embodiments, a squared-error metric is used as a measure of the difference, in particular $$\in(\omega)=|Y(\omega)-T(\omega)|^2. \quad (2)$$

Using Eq. (1), an optimal filter $\hat{H}(\omega)$ for the squared-error metric is determined as $$\hat{H}(\omega) = \frac{X^*(\omega)T(\omega)}{X^*(\omega)X(\omega)} - L(\omega) \quad (3)$$

or, in terms of statistical measures, $$\hat{H}(\omega) = \frac{R_{XT}(\omega)}{R_{XX}(\omega)} - L(\omega). \quad (4)$$

The spectral and statistical measures in Eqs. (3) and (4) may vary in time, and as such the optimal filter may vary in time. A time dependence can be included in Eq. (4) as follows:

$$\hat{H}(\omega, t) = \frac{R_{XT}(\omega, t)}{R_{XX}(\omega, t)} - L(\omega). \quad (5)$$

The statistical measures $R_{XT}(\omega,t)$ and $R_{XX}(\omega,t)$, which correspond respectively to the cross-correlation between the input and the target and the auto-correlation of the input (at frequency $\omega$ and time t), are estimated over an appropriate time scale, as will be understood by those of ordinary skill in the art. It will be further understood by those of ordinary skill in the art that the statistical measures may change over time as the input signal, the target, or both change. In some embodiments, the adaptive filter 602 is adapted at processing time t in accordance with a combination of its filter settings for a previous processing time t−1 and the optimal filter provided by adaptation control block 606 for time t, for instance as $$H(\omega,t)=\alpha H(\omega,t-1)+(1-\alpha)\hat{H}(\omega,t) \quad (6)$$

where $\alpha$ is an appropriately selected forgetting factor.

Figure 7:
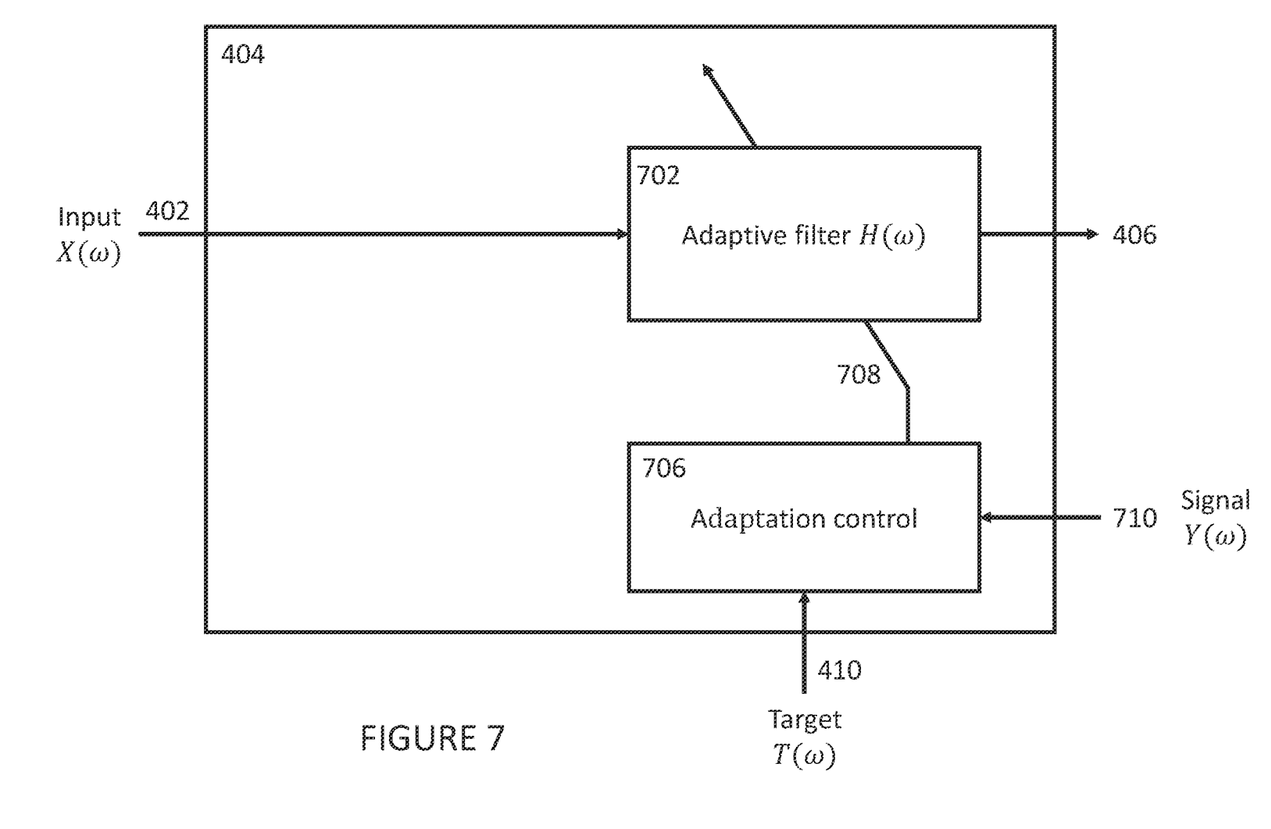
FIG. 7 is a block diagram of the adaptive processing module shown in FIG. 4 in accordance with second embodiments of the present invention.

FIG. 7 is a block diagram of the adaptive processing module 404 shown in FIG. 4 in accordance with second embodiments of the present invention. Referring to FIG. 7, the adaptive processor module 404 receives an input signal $X(\omega)$ on line 402, which corresponds to a digital form of a signal received by an externally ported microphone of the hearing device (such as the microphone 202 of the personal hearing device 200 shown in FIG. 2). The input signal $X(\omega)$ is provided as input to an adaptive filter 702. The transfer function of adaptive filter 702 is denoted by $H(\omega)$.

The signal $Y(\omega)$ is provided as input to an adaptation control module 706 on line 710. The signal $Y(\omega)$ corresponds to a signal received and transduced by an internal microphone monitoring the sound in the listener's ear canal (such as the internally ported microphone 208 of the personal hearing device 200 shown in FIG. 2). Target data T(ω) is provided to the adaptation control module 706 on line 410. The adaptation control module 706 provides control data on line 708 to an adaptive filter 702, for instance an updated filter determined in accordance with one or more of the inputs to the adaptation control module 706.

In some embodiments, the adaptation control module 706 determines an optimal filter according to a squared-error metric, for instance $$\hat{H}(\omega) = \frac{R_{XT}(\omega) - R_{XZ}(\omega)}{R_{XX}(\omega)} \quad (7)$$

where the statistical measure $R_{XZ}(\omega)$ corresponds to the cross-correlation between the input X(ω) and a leakage signal Z(ω) computed as Y(ω)–H(ω)X(ω). Those of ordinary skill in the art will appreciate that time dependencies can be incorporated into Eq. (7) as in Eq. (5), resulting in:

$$\hat{H}(\omega, t) = \frac{R_{XT}(\omega, t) - R_{XZ}(\omega, t)}{R_{XX}(\omega, t)}. \quad (8)$$

Figure 8:
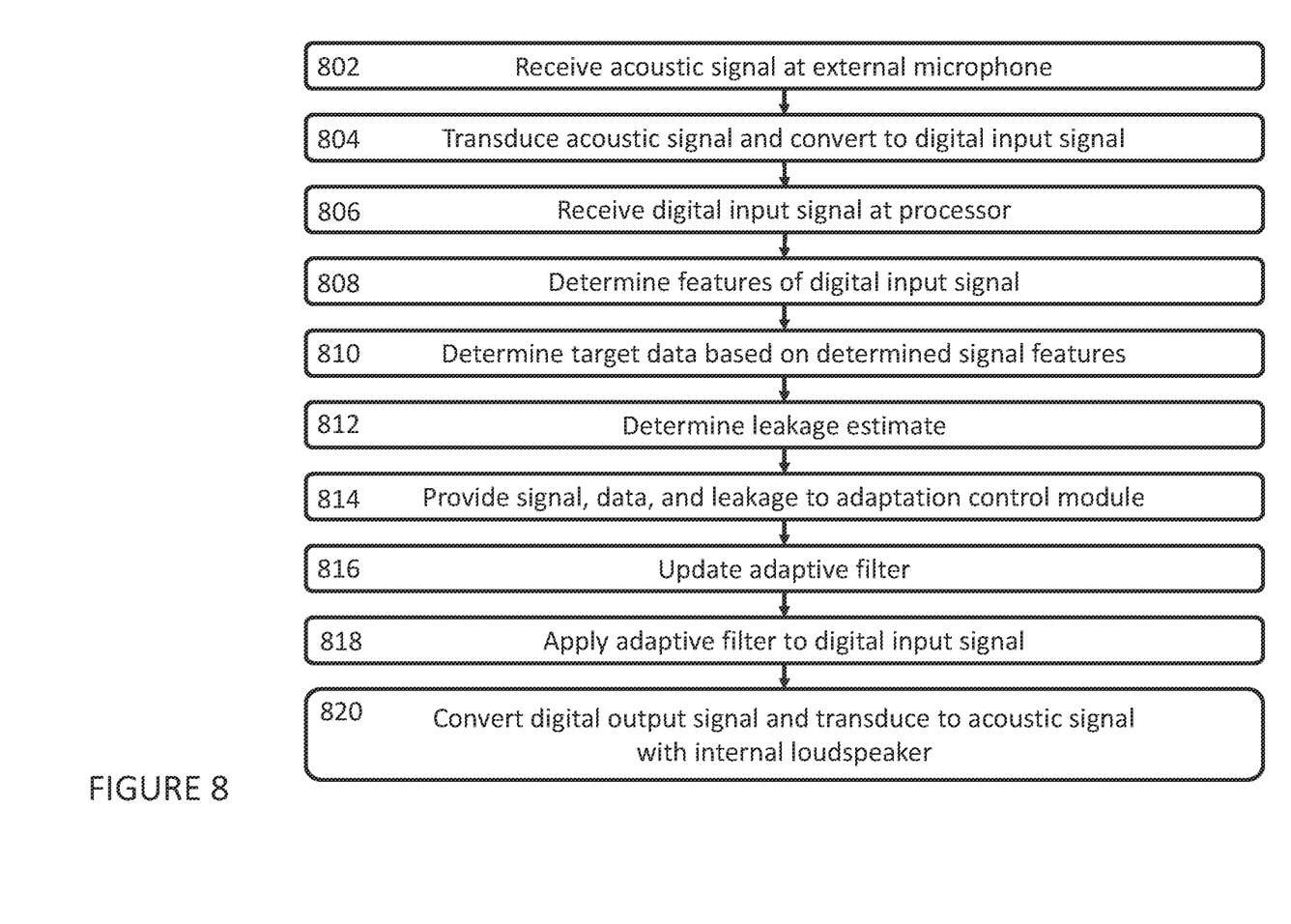
FIG. 8 is a general flow diagram illustrating the method of first set of embodiments of the present invention.

FIG. 8 is a flow diagram in accordance with a first set of embodiments of the present invention. The method begins by receiving an acoustic signal at an external microphone (box 802). For example, this external microphone can be the externally ported microphone 102 in personal hearing device 100, shown in FIG. 1. Next, the acoustic signal is transduced to electrical form by the external microphone and then converted to digital form, for instance by analog-to-digital converter 304 (box 804). The digital input signal that is generated by the analog-to-digital converter is then received by a processor (box 806), for example processor 306.

Features of the digital input signal are determined (box 808), for example in feature determination module 502. Feature determination module 502 is a component of target determination module 408, which is a component of processor 306. Next, target data is determined at least in part by the determined signal features (box 810), for instance in feature mapping module 504 shown in FIG. 5. The feature mapping module 504 is a component of target determination module 408, which is a component of processor 306.

The process continues by determining an estimate of the leakage of the external acoustic signal into the listener's ear canal (box 812), such as in leakage module 604 shown in FIG. 6. The leakage module 604 is a component of adaptive processing module 404, which is a component of processor 306. The digital input signal received by the processor in box 806, the target data determined in box 810, and the leakage estimate determined in box 814 are provided to an adaptation control module (box 814), such as the adaptation control module 606. Adaptation control module 606 is a component of adaptive processing module 404, which is a component of processor 306.

The process continues by updating the adaptive filter (box 816). In some embodiments, the adaptation control module 606 computes an updated adaptive filter, for example in accordance with Eq. (5), and provides the updated adaptive filter on line 608 to adaptive filter 602. Next, the adaptive filter is applied to the digital input signal to generate a digital output signal (box 818). For instance, in adaptive processing module 404, the adaptive filter 602 is applied to the input signal on line 402 to generate an output signal on line 406. Finally, the digital output signal is converted to analog form (box 820). For instance, this may be done by the digital-to-analog converter 308. The analog signal is then transduced to acoustic form, for instance by internally ported loudspeaker 106 in personal hearing device 100.

Figure 9:
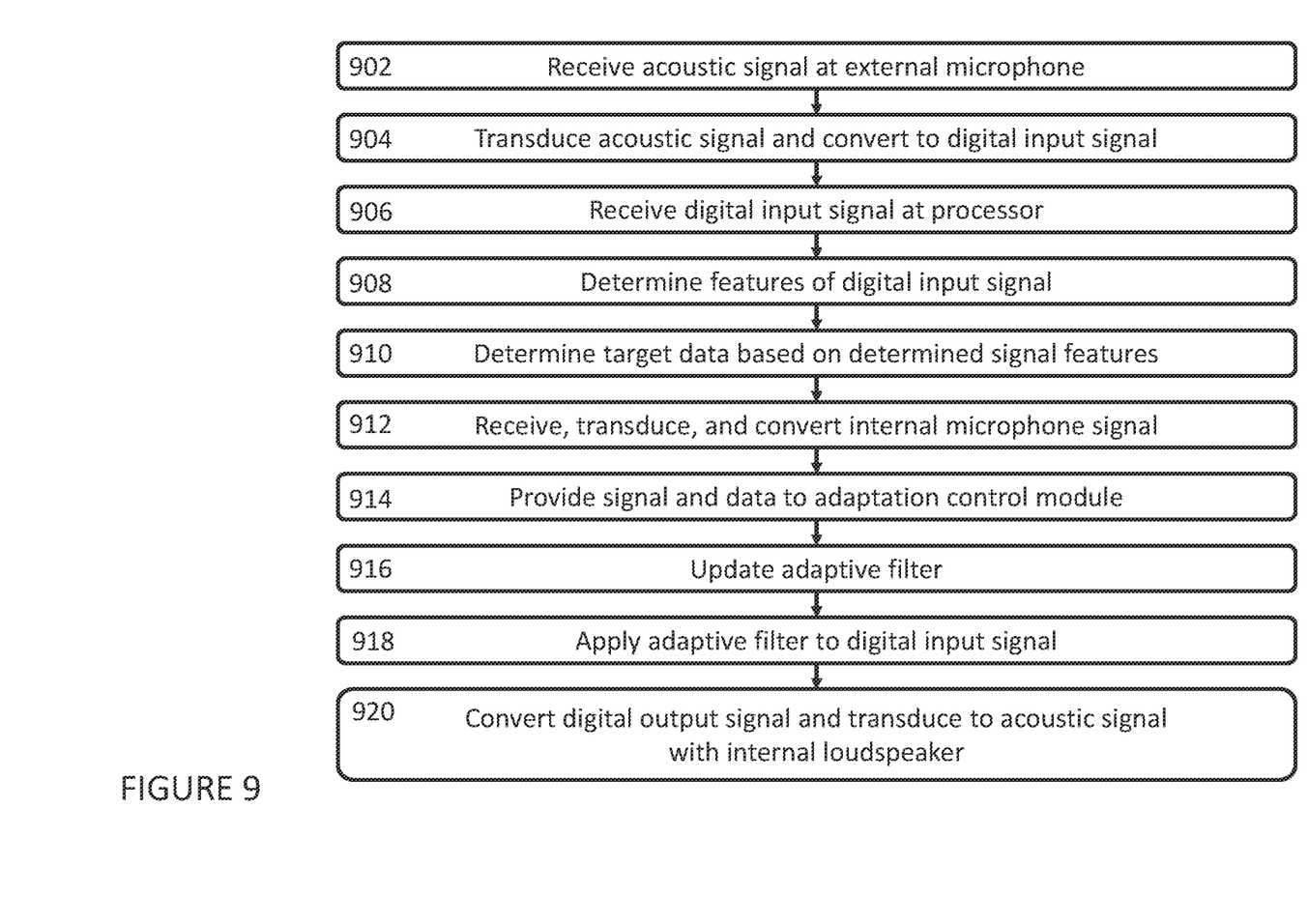
FIG. 9 is a general flow diagram illustrating the method of second set of embodiments of the present invention.

FIG. 9 is a flow diagram in accordance with a second set of embodiments of the present invention. The process begins by receiving an acoustic signal at an external microphone (box 902), for instance externally ported microphone 202 in personal hearing device 200, as shown in FIG. 2. Next, the acoustic signal is transduced to electrical form by the external microphone and then converted to digital form (box 904), for instance by analog-to-digital converter 304. The digital input signal that is generated by the analog-to-digital converter is then received by a processor (box 906), for example processor 306 shown in FIG. 3.

The process continues by determining the features of the digital input signal (box 908), for example in feature determination module 502 shown in FIG. 5. The feature determination module 502 is a component of target determination module 408, which is a component of processor 306. Target data is determined at least in part by the determined signal features (box 910), for instance in the feature mapping module 504 shown in FIG. 5. The feature mapping module 504 is a component of target determination module 408, which is a component of processor 306. Next, an acoustic signal is received at an internal microphone, for instance internally ported microphone 208 in personal hearing device 200, transduced to electrical form by the internal microphone and then converted to digital form by an analog-to-digital converter (box 912). This signal may be referred to as a monitoring signal in that it serves to monitor the sound in the listener's ear canal.

The digital monitoring signal determined in box 912 and the target data determined in box 910 are provided to an adaptation control module (box 914), for example adaptation control module 706 shown in FIG. 7. The adaptation control module 706 is a component of adaptive processing module 404, which is a component of processor 306. The target data then is provided to the adaptation control module 706 on line 410 and the digital monitoring signal is provided to the adaptation control module 706 on line 710. The adaptive filter is then updated (box 916). In some embodiments, the adaptation control module 706 computes an updated adaptive filter, for example in accordance with Eq. (8), and provides the updated adaptive filter on line 708 to adaptive filter 702. The adaptive filter then is applied to the digital input signal to generate a digital output signal (box 918). For instance, in adaptive processing module 404, the adaptive filter 702 is applied to the input signal on line 402 to generate an output signal on line 406. Finally, the digital output signal is converted to analog form (box 920). For example, this can be performed by the digital-to-analog converter 308. The analog signal is then transduced to acoustic form, for instance by internally ported loudspeaker 206 in personal hearing device 200.

Alternate Embodiments and Exemplary Operating Environment

Many other variations than those described herein will be apparent from this document. For example, depending on the embodiment, certain acts, events, or functions of any of the methods and algorithms described herein can be performed in a different sequence, can be added, merged, or left out altogether (such that not all described acts or events are necessary for the practice of the methods and algorithms). Moreover, in certain embodiments, acts or events can be performed concurrently, such as through multi-threaded processing, interrupt processing, or multiple processors or processor cores or on other parallel architectures, rather than sequentially. In addition, different tasks or processes can be performed by different machines and computing systems that can function together.

The various illustrative logical blocks, modules, methods, and algorithm processes and sequences described in connection with the embodiments disclosed herein can be implemented as electronic hardware, computer software, or combinations of both. To clearly illustrate this interchangeability of hardware and software, various illustrative components, blocks, modules, and process actions have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of this document.

The various illustrative logical blocks and modules described in connection with the embodiments disclosed herein can be implemented or performed by a machine, such as a general purpose processor, a processing device, a computing device having one or more processing devices, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor and processing device can be a microprocessor, but in the alternative, the processor can be a controller, microcontroller, or state machine, combinations of the same, or the like. A processor can also be implemented as a combination of computing devices, such as a combination of a DSP and a microprocessor, a plurality of microprocessors, one or more microprocessors in conjunction with a DSP core, or any other such configuration.

Embodiments of the system and method described herein are operational within numerous types of general purpose or special purpose computing system environments or configurations. In general, a computing environment can include any type of computer system, including, but not limited to, a computer system based on one or more microprocessors, a mainframe computer, a digital signal processor, a portable computing device, a personal organizer, a device controller, a computational engine within an appliance, a mobile phone, a desktop computer, a mobile computer, a tablet computer, a smartphone, and appliances with an embedded computer, to name a few.

Such computing devices can be typically be found in devices having at least some minimum computational capability, including, but not limited to, personal computers, server computers, hand-held computing devices, laptop or mobile computers, communications devices such as cell phones and PDA's, multiprocessor systems, microprocessor-based systems, set top boxes, programmable consumer electronics, network PCs, minicomputers, mainframe computers, audio or video media players, and so forth. In some embodiments the computing devices will include one or more processors. Each processor may be a specialized microprocessor, such as a digital signal processor (DSP), a very long instruction word (VLIW), or other micro-controller, or can be conventional central processing units (CPUs) having one or more processing cores, including specialized graphics processing unit (GPU)-based cores in a multi-core CPU.

The process actions or operations of a method, process, or algorithm described in connection with the embodiments disclosed herein can be embodied directly in hardware, in a software module executed by a processor, or in any combination of the two. The software module can be contained in computer-readable media that can be accessed by a computing device. The computer-readable media includes both volatile and nonvolatile media that is either removable, non-removable, or some combination thereof. The computer-readable media is used to store information such as computer-readable or computer-executable instructions, data structures, program modules, or other data. By way of example, and not limitation, computer readable media may comprise computer storage media and communication media.

Computer storage media includes, but is not limited to, computer or machine readable media or storage devices such as Bluray discs (BD), digital versatile discs (DVDs), compact discs (CDs), floppy disks, tape drives, hard drives, optical drives, solid state memory devices, RAM memory, ROM memory, EPROM memory, EEPROM memory, flash memory or other memory technology, magnetic cassettes, magnetic tapes, magnetic disk storage, or other magnetic storage devices, or any other device which can be used to store the desired information and which can be accessed by one or more computing devices.

A software module can reside in the RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an application specific integrated circuit (ASIC). The ASIC can reside in a user terminal. Alternatively, the processor and the storage medium can reside as discrete components in a user terminal.

The phrase "non-transitory" as used in this document means "enduring or long-lived". The phrase "non-transitory computer-readable media" includes any and all computer-readable media, with the sole exception of a transitory, propagating signal. This includes, by way of example and not limitation, non-transitory computer-readable media such as register memory, processor cache and random-access memory (RAM).

The phrase "audio signal" is a signal that is representative of a physical sound.

Retention of information such as computer-readable or computer-executable instructions, data structures, program modules, and so forth, can also be accomplished by using a variety of the communication media to encode one or more modulated data signals, electromagnetic waves (such as carrier waves), or other transport mechanisms or communications protocols, and includes any wired or wireless information delivery mechanism. In general, these communication media refer to a signal that has one or more of its characteristics set or changed in such a manner as to encode information or instructions in the signal. For example, communication media includes wired media such as a wired network or direct-wired connection carrying one or more modulated data signals, and wireless media such as acoustic, radio frequency (RF), infrared, laser, and other wireless media for transmitting, receiving, or both, one or more modulated data signals or electromagnetic waves. Combinations of the any of the above should also be included within the scope of communication media.

Further, one or any combination of software, programs, computer program products that embody some or all of the various embodiments of the system and method described herein, or portions thereof, may be stored, received, transmitted, or read from any desired combination of computer or machine readable media or storage devices and communication media in the form of computer executable instructions or other data structures.

Embodiments of the system and method described herein may be further described in the general context of computer-executable instructions, such as program modules, being executed by a computing device. Generally, program modules include routines, programs, objects, components, data structures, and so forth, which perform particular tasks or implement particular abstract data types. The embodiments described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may or may not include a processor.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various embodiments, it will be understood that various omissions, substitutions, and changes in the form and details of the devices or algorithms illustrated can be made without departing from the scope of the disclosure. As will be recognized, certain embodiments of the inventions described herein can be embodied within a form that does not provide all of the features and benefits set forth herein, as some features can be used or practiced separately from others.

What is claimed is:

1. A method for processing an incoming audio signal, comprising:
   receiving an incoming acoustic signal from an external listening environment at a microphone of a hearable device designed to be inserted in a listener's ear canal;
   transducing the incoming acoustic signal and converting it to the incoming audio signal;
   identifying, based on features of the incoming audio signal, a song included in the acoustic signal;
   determining audio characteristics of the identified song using a sound recognition application and a content library;
   actively monitoring the audio characteristics of the identified song and the external listening environment;
   providing target data that contains target performance criteria based on the audio characteristics of the identified song and the external listening environment;
   adapting the audio characteristics of the identified song to the target performance criteria to obtain adapted audio characteristics of the identified song; and
   rendering the adapted audio characteristics in an output signal which is a digital output signal.

2. The method of claim 1, further comprising rendering the adapted audio characteristics in the identified song on a personal hearing device.

3. The method of claim 1, wherein the target data includes a listener's audiogram or measured hearing loss curve.

4. The method of claim 3, wherein adapting the audio characteristics of the identified song further comprises compensating for the listener's audiogram or measured hearing loss curve.

5. The method of claim 1, wherein adapting the audio characteristics of the identified song further comprises emphasizing dialogue frequency bands to obtain the adapted audio characteristics.

6. The method of claim 1, wherein adapting the audio characteristics of the identified song further comprises updating an adaptive filter based on the target performance criteria.

7. The method of claim 1, further comprising:
   identifying a genre of a song that is in the incoming audio signal to obtain an identified genre; and
   determining the target data based on the identified genre.

8. The method of claim 1, further comprising:
   identifying audio characteristics of unwanted sounds in the incoming audio signal; and
   determining the target data based on the audio characteristics of the unwanted sounds.

9. The method of claim 1, further comprising determining a target equalization based on a knowledge of an artist's recordings.

10. The method of claim 9, further comprising using an active filter to tune the identified song to the target equalization.

11. The method of claim 1, further comprising using a machine learning technique to analyze a database containing the artist's recordings.

12. A hearable device for processing an incoming audio signal, the hearable device comprising:
   a processor; and
   a memory storing instructions that, when executed by the processor, configure the hearable device to:
   receive an incoming acoustic signal from an external listening environment at a microphone of a hearable device designed to be inserted in a listener's ear canal;
   transduce the incoming acoustic signal and converting it to the incoming audio signal;
   identify, based on features of the incoming audio signal, a song included in the acoustic signal;
   determine audio characteristics of the identified song using a sound recognition application and a content library actively monitor the audio characteristics of the identified song and the external listening environment;

provide target data that contains target performance criteria based on the audio characteristics of the identified song and the external listening environment;

adapt the audio characteristics of the identified song to the target performance criteria to obtain adapted audio characteristics of the identified song; and render the adapted audio characteristics in an output signal which is a digital output signal.

* * * * *